United States Patent [19]

Toda et al.

[11] Patent Number: 5,668,382
[45] Date of Patent: Sep. 16, 1997

[54] OHMIC ELECTRODE AND METHOD FOR FORMING IT

[75] Inventors: Naohiro Toda; Yoshiki Nishibayashi; Tadashi Tomikawa; Shin-ichi Shikata, all of Itami, Japan

[73] Assignee: Sumitomo Electric Industries, Ltd., Japan

[21] Appl. No.: 668,525

[22] Filed: Jun. 28, 1996

Related U.S. Application Data

[63] Continuation of Ser. No. 303,110, Sep. 8, 1994, abandoned.

[30] Foreign Application Priority Data

Sep. 8, 1993 [JP] Japan ............................ 5-223528

[51] Int. Cl.$^6$ ............................. H01L 31/0312; H01L 23/48; H01L 23/52; H01L 29/40
[52] U.S. Cl. ............................. 257/77; 257/751; 257/761; 257/763; 257/764; 257/770
[58] Field of Search ............................. 257/77, 75, 761, 257/763, 764, 770

[56] References Cited

U.S. PATENT DOCUMENTS 4,982,243  1/1991  Nakahata et al. .................. 357/15
5,055,424  10/1991  Zeidler et al.

FOREIGN PATENT DOCUMENTS 0390209  10/1990  European Pat. Off.
0 390 209  10/1990  European Pat. Off.

OTHER PUBLICATIONS

Japanese Journal of Applied Physics, vol. 28, No. 5.1, May 1989, Tokyo JP, pp. 758–762, H. Shiomi et al., "Electrical characteristics of metal contacts to boron–doped diamond epitaxial film," p. 761, column 2, line 39–line 51.

*Primary Examiner*—Ngân V. Ngô
*Attorney, Agent, or Firm*—Pennie & Edmonds LLP

[57] ABSTRACT

An ohmic electorde of the present invention comprises a contact electrode layer formed on a p-type diamond semiconductor layer formed on a substrate so as to be in ohmic contact with the p-type diamond semiconductor layer and to have low contact resistance and high heat resistance, and a lead electrode layer formed on the contact electrode layer so as to have low lead wire resistance and high heat resistance. Specifically, the contact electrode layer is made of either a carbide of at least one metal selected from a metal group comprising Ti, Zr, and Hf, or a carbide of an alloy containing at least one metal selected from the metal group. Since the carbide of the metal or alloy forming the contact electrode layer is stabler in respect of energy because of reduced formation enthalpy than the metal or alloy itself, it is very unlikely to diffuse. Therefore, little metal or alloy forming the contact electrode layer precipitates on the surface of the lead electrode layer formed on the contact electrode layer, thus improving the device performance, based on the reduced lead wire resistance.

18 Claims, 5 Drawing Sheets

| Sample No. | Material for contact electrode | Thickness of contact electrode (nm) | Method for forming contact electrode | Temp. of substrate (°C) | Annealing atm. | Annealing temp. (°C) | Acid solution | Change rate of wire resistance | Evaluation of ohmic property |
|---|---|---|---|---|---|---|---|---|---|
| A1 | TiC | 20 | Ion plating | Room temp. | — | — | — | 1.2 | ○ |
| A2 | ZrC | 20 | Ion plating | Room temp. | — | — | — | 1.2 | ○ |
| A3 | HfC | 15 | Ion plating | Room temp. | — | — | — | 1.3 | ○ |
| A4 | Zr-Ti-C | 20 | Sputter deposition | Room temp. | — | — | — | 1.3 | ○ |
| A5 | Hf-Ti-C | 25 | Sputter deposition | Room temp. | — | — | — | 1.2 | ○ |
| A6 | Zr-Hf-C | 30 | Sputter deposition | Room temp. | — | — | — | 1.3 | ○ |
| A7 | Ti-Zr-Hf-C | 20 | Sputter deposition | Room temp. | — | — | — | 1.2 | ○ |
| A8 | Ti | 30 | Vacuum deposition | 300 | — | — | — | 1.2 | ○ |
| A9 | Zr | 15 | Vacuum deposition | 350 | — | — | — | 1.2 | ○ |
| A10 | Ti-Zr | 30 | Sputter deposition | 400 | — | — | — | 1.3 | ○ |
| A11 | Zr-Hf | 15 | Sputter deposition | 300 | — | — | — | 1.3 | ○ |
| A12 | Ti-Zr-Hf | 20 | Sputter deposition | 300 | — | — | — | 1.2 | ○ |
| A13 | TiC | 20 | Sputter deposition | 300 | — | — | — | 1.1 | ○ |
| A14 | Ti-Hf-C | 20 | Arc ion plating | 400 | — | — | — | 1.2 | ○ |
| A15 | ZrC | 15 | Ion plating | 350 | — | — | — | 1.3 | ○ |
| A16 | Ti | 15 | Sputter deposition | Room temp. | High vacuum | 300 | — | 1.1 | ○ |
| A17 | Hf | 20 | Sputter deposition | Room temp. | High vacuum | 400 | — | 1.1 | ○ |
| A18 | Ti-Zr | 20 | Sputter deposition | Room temp. | High vacuum | 450 | — | 1.0 | ○ |
| A19 | Ti-Hf | 20 | Sputter deposition | Room temp. | High vacuum | 400 | — | 1.1 | ○ |
| A20 | Ti | 20 | Sputter deposition | Room temp. | Ar (1Torr) | 400 | — | 1.0 | ○ |
| A21 | Zr | 25 | Sputter deposition | Room temp. | Ar (1Torr) | 350 | — | 1.1 | ○ |
| A22 | Ti-Hf | 20 | Sputter deposition | Room temp. | Ar (1Torr) | 300 | — | 1.1 | ○ |
| A23 | Ti | 20 | Sputter deposition | Room temp. | High vacuum | 300 | HF | 1.2 | ○ |
| A24 | Hf | 20 | Sputter deposition | Room temp. | High vacuum | 400 | HF/HNO$_3$ | 1.1 | ○ |
| A25 | Ti-Zr-Hf | 20 | Sputter deposition | Room temp. | High vacuum | 350 | HF/HNO$_3$ | 1.2 | ○ |

Fig. 3

| Sample No. | Material for contact electrode | Thickness of contact electrode (nm) | Method for forming contact electrode | Temp. of substrate (°C) | Annealing atm. | Annealing temp. (°C) | Acid solution | Change rate of wire resistance | Evaluation of ohmic property |
|---|---|---|---|---|---|---|---|---|---|
| B1 | Ti | 20 | Sputter deposition | Room temp. | — | — | — | 11.3 | ○ |
| B2 | Zr | 20 | Sputter deposition | Room temp. | — | — | — | 10.5 | ○ |
| B3 | Ti-Hf | 25 | Sputter deposition | Room temp. | — | — | — | 12.5 | ○ |
| B4 | Ti | 20 | Sputter deposition | 250 | — | — | — | 11.2 | ○ |
| B5 | Zr-Hf | 30 | Sputter deposition | 250 | — | — | — | 10.7 | ○ |
| B6 | Ti-Zr-Hf | 25 | Sputter deposition | 250 | — | — | — | 12.0 | ○ |
| B7 | Zr | 25 | Sputter deposition | Room temp. | High vacuum | 250 | — | 5.8 | ○ |
| B8 | Ti-Zr | 30 | Sputter deposition | Room temp. | High vacuum | 200 | — | 7.1 | ○ |
| B9 | Ti | 15 | Sputter deposition | Room temp. | High vacuum | 200 | HF | 4.3 | × |
| B10 | Hf | 20 | Sputter deposition | Room temp. | High vacuum | 200 | HF/HNO$_3$ | 6.5 | × |

Fig. 5

| Sample No. | Contact electrode/ Diffusion barrier Materials | Thickness (nm) | Method for forming contact electrode | Temp. of substrate (°C) | Annealing atm. | Annealing temp. (°C) | Acid solution | Change rate of wire resistance | Evaluation of ohmic property |
|---|---|---|---|---|---|---|---|---|---|
| A 1 | Ti/Mo | 15/10 | Sputter deposition | Room temp. | — | — | — | 1.2 | ○ |
| A 2 | Ti/Mo | 200/200 | Sputter deposition | Room temp. | — | — | — | 1.1 | ○ |
| A 3 | Ti/W | 20/100 | Sputter deposition | Room temp. | — | — | — | 1.2 | ○ |
| A 4 | Ti/Ta | 15/300 | Sputter deposition | Room temp. | — | — | — | 1.1 | ○ |
| A 5 | Zr/Re | 3/50 | Electron beam evaporation | Room temp. | — | — | — | 1.2 | ○ |
| A 6 | Zr/Rh | 20/100 | Sputter deposition | Room temp. | — | — | — | 1.1 | ○ |
| A 7 | Hf/Os | 100/100 | Electron beam evaporation | Room temp. | — | — | — | 1.2 | ○ |
| A 8 | Hf/Pt | 15/300 | Sputter deposition | Room temp. | — | — | — | 1.2 | ○ |
| A 9 | V/W | 200/2000 | Sputter deposition | Room temp. | — | — | — | 1.1 | ○ |
| A 10 | Nb/Mo | 20/250 | Sputter deposition | Room temp. | — | — | — | 1.2 | ○ |
| A 11 | TaSi/Mo | 20/180 | Sputter deposition | Room temp. | — | — | — | 1.1 | ○ |
| A 12 | TiB$_2$/Re | 15/100 | Electron beam evaporation | Room temp. | — | — | — | 1.3 | ○ |
| A 13 | TiC/Mo | 20/150 | Sputter deposition | Room temp. | — | — | — | 1.2 | ○ |
| A 14 | ZrC/Ta | 20/50 | Sputter deposition | Room temp. | — | — | — | 1.2 | ○ |
| A 15 | Ti/W | 30/150 | Sputter deposition | 400 | — | — | — | 1.1 | ○ |
| A 16 | (Zr-Hf)/Mo | 15/1200 | Sputter deposition | 300 | — | — | — | 1.2 | ○ |
| A 17 | (Ti-Zr)/Pt | 20/100 | Sputter deposition | 300 | — | — | — | 1.2 | ○ |
| A 18 | TiC/W | 30/150 | Sputter deposition | 300 | — | — | — | 1.0 | ○ |
| A 19 | ZrC/Mo | 20/100 | Sputter deposition | 350 | — | — | — | 1.1 | ○ |
| A 20 | (Ti-Hf)C/Ta | 20/100 | Sputter deposition | 300 | — | — | — | 1.2 | ○ |
| A 21 | Zr/Mo | 20/100 | Sputter deposition | Room temp. | High vacuum | 350 | — | 1.2 | ○ |
| A 22 | (Ti-Hf)/W | 15/100 | Sputter deposition | Room temp. | High vacuum | 300 | — | 1.1 | ○ |
| A 23 | (Ti-Zr)/Ta | 20/80 | Sputter deposition | Room temp. | High vacuum | 400 | — | 1.2 | ○ |
| A 24 | Ti/Mo | 20/50 | Sputter deposition | Room temp. | High vacuum | 300 | HF | 1.1 | ○ |
| A 25 | Zr/Rh | 15/30 | Sputter deposition | Room temp. | High vacuum | 350 | HF/HNO$_3$ | 1.2 | ○ |
| A 26 | (Ti-Hf)/Ta | 20/50 | Sputter deposition | Room temp. | High vacuum | 350 | HF/HNO$_3$ | 1.2 | ○ |

Fig. 6

| Sample No. | Contact electrode/Diffusion barrier Materials | Thickness (nm) | Method for forming contact electrode | Temp. of substrate (°C) | Annealing atm. | Annealing temp. (°C) | Acid solution | Change rate of wire resistance | Evaluation of ohmic property |
|---|---|---|---|---|---|---|---|---|---|
| B 1 | Ti/Mo | 250/200 | Sputter deposition | Room temp. | — | — | — | 10.3 | ○ |
| B 2 | Zr/W | 400/1000 | Sputter deposition | Room temp. | — | — | — | 11.9 | ○ |
| B 3 | Ti/Ta | 300/200 | Sputter deposition | 200 | — | — | — | 9.8 | ○ |
| B 4 | (Ti-Zr)/Mo | 400/800 | Sputter deposition | 250 | — | — | — | 10.6 | ○ |
| B 5 | Ti-Hf/Ta | 300/800 | Sputter deposition | Room temp. | High vacuum | 200 | — | 10.0 | ○ |
| B 6 | Ti/W | 250/500 | Sputter deposition | Room temp. | High vacuum | 250 | — | 11.7 | ○ |
| B 7 | Hf/Re | 300/950 | Sputter deposition | Room temp. | High vacuum | 300 | — | 4.8 | ○ |
| B 8 | Zr/Rh | 300/400 | Sputter deposition | Room temp. | High vacuum | 400 | — | 5.4 | ○ |
| B 9 | Ti/Mo | 300/500 | Sputter deposition | Room temp. | High vacuum | 200 | HF | 1.2 | × |

OHMIC ELECTRODE AND METHOD FOR FORMING IT

This is a continuation of application Ser. No. 08/303,110, filed Sep. 8, 1994, now abandoned.

BACKGROUND OF THE INVENTION

1. Field of the Invention

The present invention relates to an ohmic electrode with high heat resistance and low contact resistance, formed on a p-type diamond semiconductor and a method for forming it.

2. Related Background Art

Diamond has a large bandgap of about 5.5 eV and thus has no temperature range corresponding to the intrinsic region below 1400° C. It is, therefore, excellent in heat resistance. Also, diamond has the thermal conductivity of 20 W/cm·K, which is ten times larger than that of silicon. Thus, it is also excellent in heat radiation. Because of such properties, semiconductor devices made of diamond can be operated at high temperature and can be improved in the degree of integration of circuits.

These days, p-type diamond semiconductors formed by doping diamond with boron are expected to be applied to light-emitting devices to emit light in the range of various wavelengths from ultraviolet light to visible light, environmentally resistant semiconductor devices required to have high heat resistance and high thermal conductivity, and etc. In order to produce such semiconductor devices, ohmic electrodes formed on the p-type diamond semiconductor need to be provided with high heat resistance and low contact resistance.

A conventional ohmic electrode is formed by successively building a contact electrode layer of Ti, a diffusion barrier layer of Mo, and a lead electrode layer of Au up on a p-type diamond semiconductor. Ti forming the contact electrode layer is a metal having a relatively high melting point, but has a resistivity of higher than materials such as Au, Al, etc. Thus, Au is layered as a lead electrode layer above the contact electrode layer so as to reduce lead wire resistance in order to improve device performance.

However, when the lamination structure of Ti and Au is subjected to heat treatment at a temperature of about 300° C., Ti forming the contact electrode layer readily diffuses into Au forming the lead electrode layer to precipitate over the surface of the lead electrode layer, thus increasing the lead wire resistance. Even in use at room temperature current supply to such a semiconductor device causes Joule heat generated to induce mutual diffusion of Ti and Au, which results in precipitation of Ti over the surface of the lead electrode layer. To prevent the diffusion of Ti, Mo is interposed as a diffusion barrier layer between the contact electrode layer and the lead electrode layer.

The above prior art technology is described in detail in Japanese Laid-open Patent Applications No. 1-246867 and No. 2-260470.

In the above conventional ohmic electrode the thickness of Ti forming the contact electrode layer is, however, relatively large, i.e., about 300 to 500 nm. Then, the interposition of Mo as the diffusion barrier layer between the contact electrode layer and the lead electrode layer cannot fully prevent Ti from diffusing from the contact electrode layer toward the lead electrode layer. As a result, Ti precipitates over the surface of the lead electrode layer of Au, which raised a problem of degrading the device performance because of an increase in lead wire resistance.

The present invention has been accomplished to solve the above problem. It is, therefore, an object of the present invention to provide an ohmic electrode formed on a p-type diamond semiconductor, which can improve the device performance, based on reduced lead wire resistance, and a method for forming the ohmic electrode.

SUMMARY OF THE INVENTION

Achieving the above object, an ohmic electrode of the present invention comprises a contact electrode layer formed on a p-type diamond semiconductor layer formed on a substrate so as to be in ohmic contact with the p-type diamond semiconductor layer and to have low contact resistance and high heat resistance, and a lead electrode layer formed on the contact electrode layer so as to have low lead wire resistance and high heat resistance, in which the contact electrode layer is made of either a carbide of at least one metal selected from a metal group comprising Ti, Zr, and Hf, or a carbide of an alloy containing at least one metal selected from the metal group.

Achieving the above object, another ohmic electrode of the present invention comprises a contact electrode layer formed on a p-type diamond semiconductor layer formed on a substrate so as to be in ohmic contact with the p-type diamond semiconductor layer and to have low contact resistance and high heat resistance, a diffusion barrier layer formed on the contact electrode layer, and a lead electrode layer formed on the diffusion barrier layer so as to have low lead wire resistance and high heat resistance, in which the contact electrode layer is so formed as to have a thickness in the range of 3 to 200 nm and in which the diffusion barrier layer is made of either at least one metal selected from a metal group comprising W, Mo, Ta, Os, Re, Rh, and Pt, or an alloy containing at least one metal selected from the metal group.

Here, the above contact electrode layer may be made of either a carbide of at least one metal selected from a metal group comprising Ti, Zr, and Hf, or a carbide of an alloy containing at least one metal selected from the said metal group.

Achieving the above object, a method for forming an ohmic electrode of the present invention comprises a first step of vapor-depositing either at least one metal selected from a metal group comprising Ti, Zr, and Hf or a carbide thereof, or an alloy containing at least one metal selected from the said metal group or a carbide thereof on a p-type diamond semiconductor layer formed on a substrate to form a contact electrode layer being in ohmic contact with the p-type diamond semiconductor layer and having low contact resistance and high heat resistance, and a second step of forming by vapor deposition a lead electrode layer having low lead wire resistance and high heat resistance on the contact electrode layer formed in the first step, in which the first step comprises a heat treatment of the contact electrode layer at a temperature of not lower than 300° C.

Achieving the above object, another method for forming an ohmic electrode of the present invention comprises a first step of forming by vapor deposition a contact electrode layer having a thickness in the range of 3 to 200 nm, on a p-type diamond semiconductor layer formed on a substrate so as to make the contact electrode layer in ohmic contact with the p-type diamond semiconductor layer, a second step of vapor-depositing either at least one metal selected from a metal group comprising W, Mo, Ta, Os, Re, Rh, and Pt, or an alloy containing at least one metal selected from the metal group on the contact electrode layer formed in the first step so as to form a diffusion barrier layer, and a third step of forming by vapor deposition a lead electrode layer having low lead wire resistance and high heat resistance on the diffusion barrier layer formed in the second step, in which the first step comprises a heat treatment of the contact electrode layer at a temperature of not lower than 300° C.

Here, the above heat treatment may be to heat the substrate at a temperature of not lower than 300° C. when the contact electrode layer is formed by vapor deposition on the p-type diamond semiconductor layer. Also, the above heat treatment may be to heat the contact electrode layer in an environment having a temperature of not lower that 300° C. after the contact electrode layer has been formed by vapor deposition on the p-type diamond semiconductor layer.

In the ohmic electrode of the present invention, the contact electrode layer made of either the carbide of at least one metal selected from the metal group comprising Ti, Zr, and Hf, or the carbide of an alloy containing at least one metal selected from the metal group is formed on the p-type diamond semiconductor layer formed on the substrate, as being in ohmic contact therewith.

The inventors of the present application have verified that the contact resistance was low between the contact electrode layer and the p-type diamond semiconductor layer. Further, the inventors of the present application presumed that the diffusion was very unlikely to occur, because the carbide of the metal or the alloy forming the contact electrode layer was stabler in respect of energy because of reduced formation enthalpy than the metal or alloy itself. The Inventors also have verified that the metal or alloy forming the contact electrode layer sometimes precipitated, though in a small amount, on the surface of the lead electrode layer in actuality, which was because the metal or alloy remained without forming the carbide in some portions of the contact electrode layer caused mutual diffusion with a substance, such as Au, forming the lead electrode layer and that the precipitation was not due to diffusion of the carbide of the metal or alloy.

Accordingly, the metal or alloy forming the contact electrode layer rarely precipitates on the surface of the lead electrode layer formed on the contact electrode layer, thus enhancing the device performance, based on the reduced lead wire resistance.

In another ohmic electrode of the present invention, the contact electrode layer is formed in the thickness of 3 to 200 nm on the p-type diamond semiconductor layer formed on the substrate, as being in ohmic contact therewith. Further, on the contact electrode layer the diffusion barrier layer is formed of either at least one metal selected from the metal group comprising W, Mo, Ta, Os, Re, Rh, and Pt, or an alloy containing at least one metal selected from the metal group.

When the ohmic electrode is used under an environment of high temperature, the metal or alloy forming the contact electrode layer starts diffusing to become ready for mutual diffusion with the substance, such as Au, forming the lead electrode layer, which is effectively restricted by the diffusion barrier layer formed on the contact electrode layer. As soon as the metal or alloy forming the contact electrode layer starts diffusing, it comes to react with the p-type diamond semiconductor layer. Thus, most of the metal or alloy becomes a carbide thereof because the layer is thin. Thus, the diffusion is further suppressed, because the carbide of the metal or alloy forming the contact electrode layer is stable in respect of energy.

Therefore, the device performance is enhanced based on the reduced lead wire resistance, because the metal or alloy forming the contact electrode layer rarely precipitates on the surface of the lead electrode layer formed above the contact electrode layer.

Actually, there could remain a trace of the metal or alloy forming the contact electrode layer without forming the carbide thereof. Although this trace of the metal or alloy could cause the mutual diffusion with the substance, such as Au, forming the lead electrode layer so as to precipitate on the surface of the lead electrode layer, the amount of precipitates would be very small, which would rarely increase the lead wire resistance so much.

Preferably, the contact electrode layer is made of the carbide of at least one metal selected from the metal group comprising Ti, Zr, and Hf, or a carbide of an alloy containing at least one metal selected from the said metal group. This further prevents the metal or alloy forming the contact electrode layer from precipitating on the surface of the lead electrode layer formed on the diffusion barrier layer, thus further reducing the lead wire resistance.

According to the method for forming the ohmic electrode of the present invention, the first step comprises the heat treatment to heat the substrate at a temperature of not lower than 300° C. in forming the contact electrode layer by vapor-depositing either at least one metal selected from the metal group comprising Ti, Zr, and Hf or a carbide thereof, or an alloy containing at least one metal selected from the metal group or a carbide thereof. In another embodiment, such a contact electrode layer is first formed and thereafter the heating treatment is carried out by heat the contact electrode layer in an environment having a temperature of not lower than 300° C.

According to another method for forming the ohmic electrode of the present invention, the first step comprises the heat treatment to heat the substrate at a temperature of not lower than 300° C. in forming the contact electrode layer by vapor deposition in the thickness of 3 to 200 nm on the p-type diamond semiconductor layer. In another embodiment, such a contact electrode layer is first formed and thereafter the heat treatment is carried out by heating the contact electrode layer in an environment having a temperature of not lower than 300° C.

The heating causes the metal or alloy forming the contact electrode layer to thermally diffuse into the p-type diamond semiconductor layer, and vice versa, reacting with diamond to form its carbide. Comparing with the method for directly forming the carbide of the metal or alloy forming the contact electrode layer on the p-type diamond semiconductor layer, the contact resistance to the p-type diamond semiconductor layer is reduced, because a superior interface with less defects is formed between the p-type diamond semiconductor layer and the contact electrode layer.

The metal or alloy forming the contact electrode layer becomes stabilized in respect of energy by the formation of carbide, so that the metal or alloy is unlikely to diffuse and, therefore, it rarely precipitates on the surface of the lead electrode, lowering the lead wire resistance. Since the carbide of the metal or alloy forming the contact electrode layer is stabler up to near the melting point higher than that of the metal or alloy itself, it is excellent in heat resistance.

Accordingly, the ohmic contact with high heat resistance and low contact resistance can be formed with excellent reproducibility on the p-type diamond semiconductor layer.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

The structure and operation of embodiments according to the present invention will be described with reference to FIG. 1 to FIG. 6. In the description with the drawings, identical elements will be denoted by same reference numerals and redundant description will be omitted. It should be noted that the ratio of the dimensions in the drawings does not always coincide with that in the description.

In the following description, a IVA-group metal or a IVA-group alloy means at least one metal selected from a metal group consisting of Ti, Zr, and Hf, or an alloy containing at least one metal selected from the said metal group, respectively.

Figure 1:
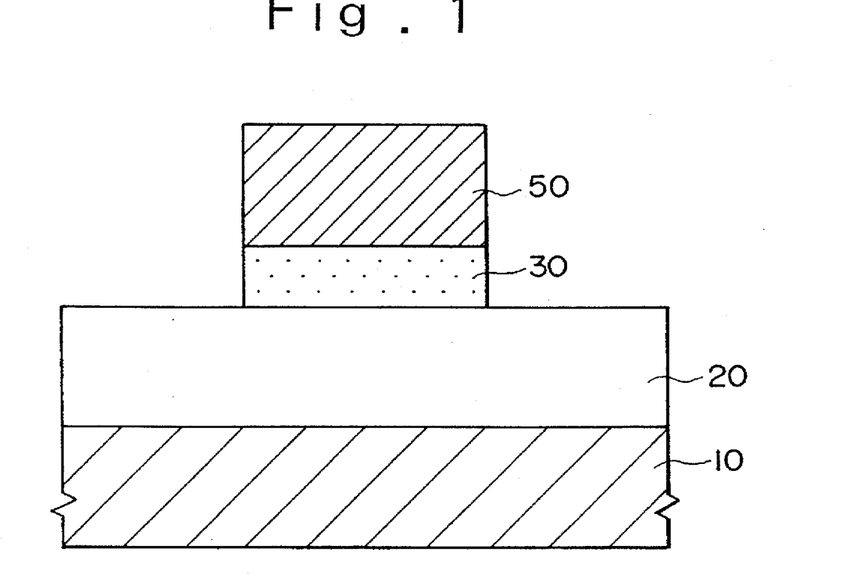
FIG. 1 is a cross-sectional view to show the structure of a first embodiment associated with an ohmic electrode of the present invention.

FIG. 1 shows the structure of the first embodiment associated with an ohmic electrode of the present invention.

A contact electrode layer 30 and a lead electrode layer 50 are successively layered on a p-type diamond layer 20 formed on a substrate 10. The contact electrode layer 30 is made of a carbide of a IVA-group metal or alloy with high heat resistance, which is in ohmic contact with the p-type diamond layer 20. The lead electrode layer 50 is made mainly of a substance, such as Au.

The operation of the first embodiment is next described.

Since the carbide of the metal or alloy forming the contact electrode layer 30 is much stabler in energy because of the reduced formation enthalpy than the metal or alloy itself, it is very unlikely to diffuse. Thus, the metal or alloy forming the contact electrode layer 30 rarely precipitates on the surface of the lead electrode layer 50 formed on the contact electrode layer 30, thereby improving the device performance, based on the reduced lead wire resistance.

In fact, a trace of the metal or alloy forming the contact electrode layer 30 precipitates on the surface of the lead electrode layer 50, which is because the metal or alloy remained without forming the carbide in some portions of the contact electrode layer 30 is subject to the mutual diffusion with the substance, such as Au, or other components forming the lead electrode layer 50. That is, the precipitation is not caused by the diffusion of the carbide of the metal or alloy forming the contact electrode layer 30.

Next described is a method for forming the above ohmic electrode in the first embodiment.

First, a IVA-group metal or alloy, or a carbide thereof is vapor-deposited on the p-type diamond layer 20 formed on the substrate 10 to form the contact electrode layer 30. Then, the substance, such as Au, is vapor-deposited on the contact electrode layer 30 to form the lead electrode layer 50.

The vapor deposition method may be selected from various techniques including the ion plating method, the arc ion plating method, the sputter deposition method, the vacuum vapor deposition method, and the electron beam evaporation method.

Also, the contact electrode layer 30 may be formed in such a manner that the substrate is first set at a temperature of not lower than 300° C. by heating an electrode portion of the substrate 10 and then the IVA-group metal or alloy is vapor-deposited on the p-type diamond layer 20.

Further, the heat treatment of the contact electrode layer 30 may be such that after the IVA-group metal or alloy has been vapor-deposited on the p-type diamond layer 20, the resultant is annealed in an environment of vacuum or Ar gas as heated at a temperature of not lower than 300° C.

Further, after the formation of the contact electrode layer 30 and before the formation of the lead electrode layer 50, the contact electrode layer 30 may be washed with an acid solution, such as hydrofluoric acid (HF) or hydrofluoric acid/nitric acid (HF/HNO$_3$).

Moreover, if the thickness of the contact electrode layer 30 is not more than 200 nm, a heat treatment may be conducted in forming the lead electrode layer 50 in the same manner as in the formation of the contact electrode layer 30.

Next described are the operational effects of the method for forming the ohmic electrode in the first embodiment.

Since the carbide of the IVA-group metal or alloy has the reduced formation enthalpy as compared with the metal or alloy itself, the vapor deposition of the carbide of the IVA-group metal or alloy on the p-type diamond layer 20 can keep the metal or alloy forming the contact electrode layer 30 stabler in energy whereby the metal or alloy is very unlikely to diffuse.

When the IVA-group metal or alloy is vapor-deposited on the p-type diamond layer 20 and then the heat treatment is conducted at a temperature of not lower than 300° C., the metal or alloy forming the contact electrode layer 30 thermally diffuses toward the p-type diamond layer 20 and vice versa, reacting with diamond to form the carbide thereof. Comparing with the case where the carbide of the metal or alloy forming the contact electrode layer 30 is directly formed on the p-type diamond layer 20, an excellent interface with less defects is formed between the p-type diamond layer 20 and the contact electrode layer 30, thus reducing the contact resistance to the p-type diamond layer 20.

As described, the metal or alloy forming the contact electrode layer 30 is stabilized in respect of energy by the formation of the carbide thereof, which hardly diffuses. Also, the carbide of the metal or alloy forming the contact electrode layer 30 is move stable up to near the melting point higher than that of the metal or alloy itself and, therefore, it is excellent in heat resistance.

Accordingly, little metal or alloy forming the contact electrode layer 30 precipitates on the surface of the lead electrode layer 50, thus lowering the lead wire resistance. Therefore, the ohmic contacts with high heat resistance and low contact resistance can be formed with excellent reproducibility on the p-type diamond layer 20.

Washing the contact electrodes layer 30 with the acid solution after the formation of the contact electrode layer 30 and before the formation of the lead electrode layer 50, the metal or alloy remained without forming the carbide can be removed from the contact electrode layer 30.

Further, adhesion is improved between the layered contact electrode layer 30 and lead electrode layer 50 by forming the lead electrode layer 50 heated similarly as the contact electrode layer 30 in case of the thickness of the contact electrode layer 30 being not more than 200 nm.

The following describes experiments as to the first embodiment.

Figure 2:
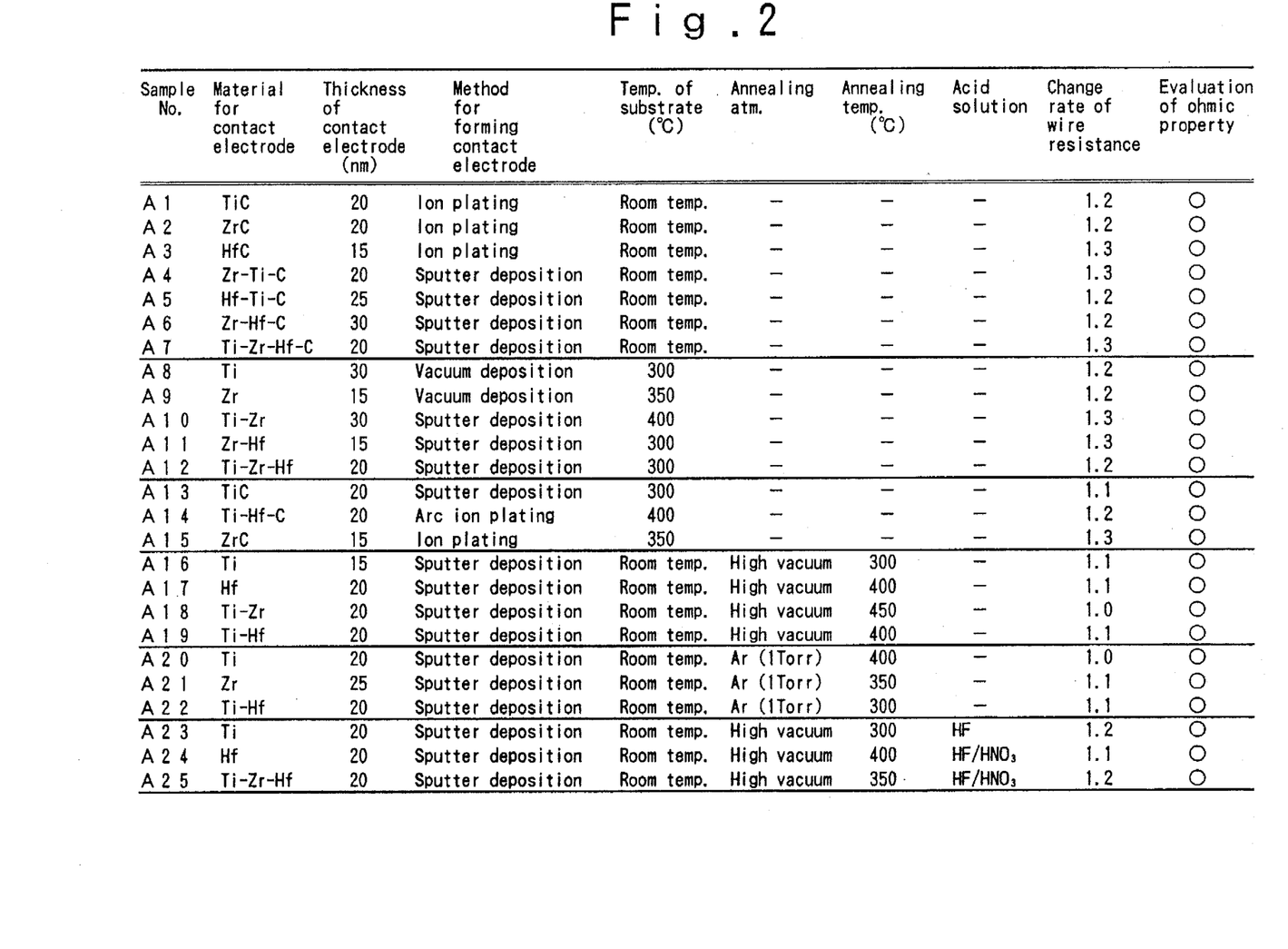
FIG. 2 is a table to show forming conditions and performance evaluation results in the first embodiment.

First, FIG. 2 shows formation conditions and performance evaluation results for the above first embodiment. Samples No. A1 through A7 were prepared in such a manner that while the substrate 10 and the atmosphere were held at the room temperature, a carbide of a IVA-group metal or alloy was vapor-deposited as the contact electrode layer 30 and, subsequently, the substance, such as Au, was vapor-deposited in the thickness of about 200 nm as the lead electrode layer 50.

Also, samples No. A8 through A12 were prepared as follows. The substrate 10 was first heated up to a temperature of not lower than 300° C. and then a IVA-group metal or alloy was vapor-deposited as the contact electrode layer 30. Next, the temperature of the substrate 10 was reduced down to the room temperature, and then substance, such as Au, was vapor-deposited in the thickness of about 200 nm as the lead electrode layer 50.

Further, samples No. A13 through A15 were prepared as follows. The substrate 10 was first heated up to a temperature of not lower than 300° C. and then a carbide of a IVA-group metal or alloy was vapor-deposited as the contact electrode layer 30. Next, the temperature of the substrate 10 was reduced down to the room temperature and the substance, such as Au, was vapor-deposited in the thickness of about 200 nm as the lead electrode layer 50.

Additionally, samples No. A16 through A19 were prepared as follows. While the temperature of the substrate 10 and the atmosphere was held at the room temperature, a IVA-group metal or alloy was vapor-deposited as the contact electrode layer 30, and thereafter the resultant was subjected to an annealing treatment to heat it at a temperature of not lower than 300° C. in vacuum of below 10 Torr, preferably below 5 Torr for thirty minutes. Next, the temperature of the environment was reduced down to the room temperature and then the substance, such as Au, was vapor-deposited in the thickness of about 200 nm as the lead electrode layer 50.

Moreover, samples No. A20 through A22 were prepared as follows. While the temperature of the substrate 10 and the atmosphere was held at the room temperature, a IVA-group metal or alloy was vapor-deposited as the contact electrode layer 30, and thereafter the resultant was subjected to an annealing treatment to heat it at a temperature of not lower than 300° C. in an environment of Ar gas under the pressure of below 1 Torr for thirty minutes. Next, the temperature of the environment was reduced down to the room temperature and then the substance, such as Au, was vapor-deposited in the thickness of about 200 nm as the lead electrode layer 50.

Further, samples No. A23 through A25 were prepared as follows. While the temperature of the substrate 10 and the atmosphere was held at the room temperature, a IVA-group metal or alloy was vapor-deposited as the contact electrode layer 30, and thereafter the resultant was subjected to an annealing treatment to heat it at a temperature of not lower than 300° C. in vacuum of below 10 Torr, preferably below 5 Torr for thirty minutes. Next, the contact electrode layer 30 was washed with an acid solution, such as hydrofluoric acid or hydrofluoric acid/nitric acid, to remove the metal or alloy remained without forming the carbide. Subsequently, the temperature of the environment was reduced down to the room temperature and then the substance, such as Au, was vapor-deposited in the thickness of about 200 nm as the lead electrode layer 50.

The thus formed samples No. A1 through A25 were subjected to a heat treatment at a temperature of 500° C. in vacuum of below $10^{-5}$ Torr for thirty minutes. The resistivity of the lead wire resistance was measured by the four-probe method before and after the treatment to evaluate the heat resistance, based on a change in the resistivity.

The results of the measurement demonstrated that the lead wire resistance of each sample was nearly equal to a resistance value of Au normally formed in bulk before and after the heat treatment and that a change rate of the wire resistance of each sample was small. It was also observed that the surface of the lead electrode layer 30 had a color after the heat treatment, nearly identical with its original color. It is thus understood that high heat resistance was well achieved.

In another experiment, samples No. A1 through A25 were subjected to a heat treatment at a temperature of 500° C. in vacuum of below $10^{-5}$ Torr for thirty minutes. The contact resistance was measured by the TLM method before and after this treatment to evaluate the ohmic property to the p-type diamond layer 20, based on a change in the contact resistance.

The results of the measurement demonstrated that the contact resistance of each sample was kept nearly unchanged before and after the heat treatment as to be a value below $1 \times 10^{-3}$ $\Omega \cdot cm^2$. It is thus understood that excellent ohmic property was achieved.

Figure 3:
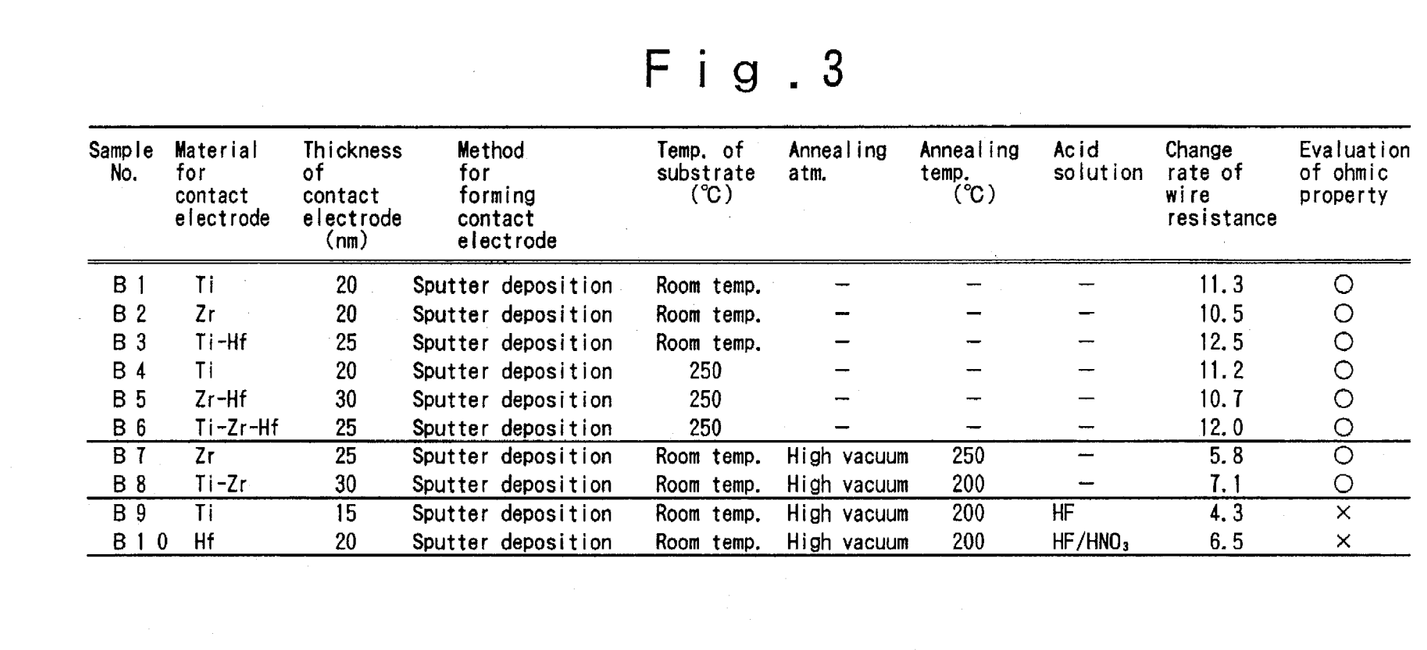
FIG. 3 is a table to show forming conditions and performance evaluation results for comparative examples to the first embodiment.

Next, FIG. 3 shows formation conditions and performance evaluation results of comparative examples to the above first embodiment. Samples No. B1 through B6 were prepared as follows. While the temperature of the substrate 10 and the atmosphere was held at the room temperature or at a temperature of lower than 300° C., a IVA-group metal or alloy was vapor-deposited as the contact electrode layer 30. Next, while the temperature of the substrate 10 and the atmosphere was kept at the room temperature, the substance, such as Au, was vapor-deposited in the thickness of about 200 nm as the lead electrode layer 50. (These samples correspond to the samples No. A1 through A15.)

Also, samples No. B7 through B8 were prepared as follows. While keeping the temperature of the substrate 10 and the atmosphere at the room temperature, a IVA-group metal or alloy was vapor-deposited as the contact electrode layer 30. Then, the resultant was subjected to an annealing treatment to heat it at a temperature of lower than 300° C. in vacuum of below 5 Torr for thirty minutes. Next, the temperature of the environment was reduced down to the room temperature and then the substance, such as Au, was vapor-deposited in the thickness of about 200 nm as the lead electrode layer 50. (These samples correspond to the samples No. A16 through A19.)

Further, samples No. B9 and B10 were prepared as follows. While keeping the temperature of the substrate 10 and the atmosphere at the room temperature, a IVA-group metal was vapor-deposited as the contact electrode layer 30. Then, the resultant was subjected to an annealing treatment to heat it at a temperature of lower than 300° C. in vacuum of below 5 Torr for thirty minutes. Next, the contact electrode layer 30 was washed with an acid solution, such as hydrofluoric acid or hydrofluoric acid/nitric acid, to remove the metal or alloy remained without forming the carbide. Subsequently, the temperature of the environment was reduced down to the room temperature and then the substance, such as Au, was vapor-deposited in the thickness of about 200 nm as the lead electrode layer 50. (These samples correspond to the samples No. A23 through A25.)

The thus formed samples No. B1 through B10 were subjected to a heat treatment at a temperature of 500° C. in vacuum of below $10^{-5}$ Torr for thirty minutes. The resistivity of the lead wire resistance was measured by the four-probe method before and after the heat treatment to evaluate the heat resistance, based on a change in the resistivity.

The results of the measurement demonstrated that samples No. B1 through B8 before the heat treatment had the lead wire resistance approximately equal to the resistance value of Au normally formed in bulk, but the samples after the heat treatment had increased resistance. Change rates of the resistance were considerably large, over ten times. Also, the surface of the lead electrode layer 50 showed completely different colors before and after the heat treatment. Analysis of composition was conducted for the surface of the lead electrode layer 50, which showed that the metal or alloy forming the contact electrode layer 30 precipitated and no Au remained. It is thus understood that satisfactory heat resistance was not achieved.

On the other hand, samples No. B9 and B10 before the heat treatment showed the lead wire resistance approximately equal to the resistance value of Au normally formed in bulk, but the samples after the heat treatment increased the resistance. Change rates of the resistance were large, i.e., several times. It is thus understood that satisfactory heat resistance was not achieved.

In another experiment, the samples No. B1 through B10 were subjected to a heat treatment at a temperature of 500° C. in vacuum of below $10^{-5}$ Torr for thirty minutes. The contact resistance was measured by the TLM method before and after this heat treatment to evaluate the ohmic property to the p-type diamond layer 20, based on a change in the contact resistance.

The results of the measurement demonstrated that the samples No. B9 and B10 showed large values of the contact resistance before and after the heat treatment. For these electrodes, element analysis was conducted in the direction of the thickness. The results of the analysis showed that little element forming the contact electrode layer 30 was detected near the interface to the p-type diamond layer 20. This indicates that because the temperature of the annealing treatment after the formation of the contact electrode layer 30 was low, i.e., below 300° C., the metal or alloy forming the contact electrode layer 30 did not form the carbide thereof well near the interface to the p-type diamond layer 20 whereby the metal or alloy forming the contact electrode layer 30 was removed when washed with the acid solution. It is thus understood that satisfactory ohmic property was not achieved.

On the other hand, the samples No. B1 through B8 showed small values of the contact resistance before and after the heat treatment similarly. It is thus understood that satisfactory ohmic property was achieved.

Figure 4:
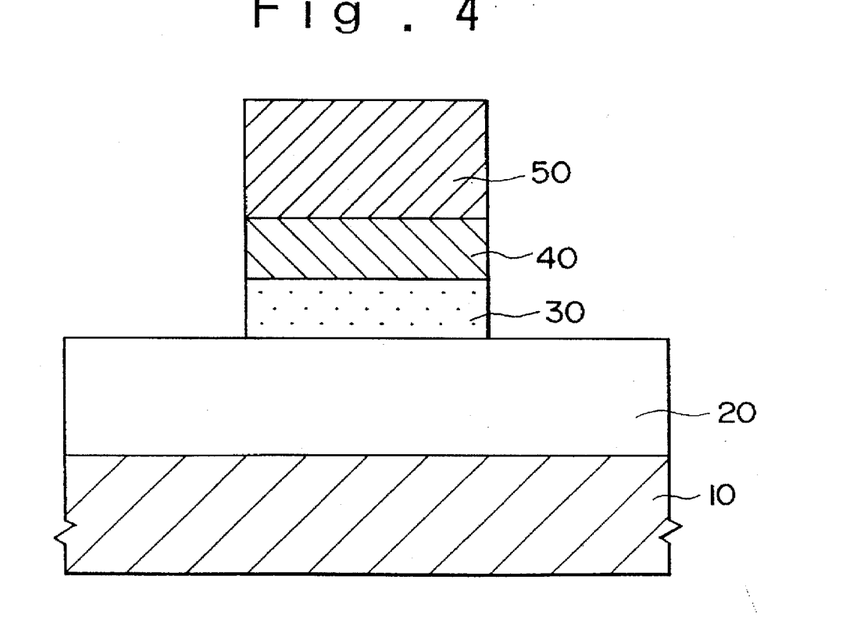
FIG. 4 is a cross-sectional view to show the structure of a second embodiment associated with an ohmic electrode of the present invention.

FIG. 4 shows the structure of the second embodiment associated with another ohmic electrode of the present invention.

A contact electrode layer 30, a diffusion barrier layer 40, and a lead electrode layer 50 are successively layered on a p-type diamond layer 20 formed on a substrate 10. The contact electrode layer 30 is made of a IVA-group metal or alloy, which has a thickness in the range of 3 to 200 nm, preferably in the range of 3 to 50 nm, and which is in ohmic contact with the p-type diamond layer 20. The diffusion barrier layer 40 is made of either at least one metal selected from a metal group consisting of W, Mo, Ta, Os, Re, Rh, and Pt, or an alloy containing at least one metal selected from the metal group. The lead electrode layer 50 is made mainly of the substance, such as Au. Preferably, the contact electrode layer 30 is made of a carbide of a IVA-group metal or alloy.

The operation of the second embodiment is next described.

When the ohmic electrode of the second embodiment is used under an environment at a high temperature, the metal or alloy forming the contact electrode layer 30 starts diffusing. Thus, mutual diffusion would occur between the metal or alloy and the substance, such as Au and other components forming the lead electrode layer 50. However, the diffusion barrier layer 40 formed on the contact electrode layer 30 suppresses the diffusion of the metal or alloy forming the contact electrode layer 30.

As soon as the metal or alloy forming the contact electrode layer 30 starts diffusing, it starts reacting with the p-type diamond layer 20. Since the contact electrode layer 30 is thin, most of the metal or alloy forming the contact electrode layer 30 forms a carbide thereof to become stabilized in respect of energy. This results in further suppressing the diffusion of the metal or alloy forming the contact electrode layer 30.

Accordingly, little metal or alloy forming the contact electrode layer 30 precipitates on the surface of the lead electrode layer 50 formed above the contact electrode layer 30, thus improving the device performance, based on the reduced lead wire resistance.

Here, if the thickness of the contact electrode layer 30 exceeds 200 nm, or if the thickness of the contact electrode layer 30 exceeds 50 nm in the case that a further reduction of the lead wire resistance is to be desired, the diffusion barrier layer 40 cannot fully suppress the diffusion of the metal or alloy forming the contact electrode layer 30. On the other hand, if the thickness of the contact electrode layer 30 is less than 3 nm, a satisfactory ohmic contact cannot be attained with small contact resistance to the p-type diamond layer 20.

If the thickness of the diffusion barrier layer 40 is less than 10 nm, the diffusion barrier layer 40 cannot fully suppress the diffusion of the metal or alloy forming the contact electrode layer 30. On the other hand, if the thickness of the diffusion barrier layer 40 exceeds 2000 nm, the resistance as an electrode becomes so huge as to fail to obtain practical conductivity.

Actually, a small amount of the metal or alloy forming the contact electrode layer 30 could remain without forming the carbide thereof. Mutual diffusion occurs between the small amount of the metal or alloy and the substance, such as Au, forming the lead electrode layer 50, so that the remaining metal or alloy precipitates on the surface of the lead electrode layer 50. However, an amount of the precipitates is very fine, thus not increasing the lead wire resistance greatly.

If the contact electrode layer 30 is made of a carbide of a IVA-group metal or alloy, which is stable in energy, the diffusion of the metal or alloy is much more unlikely to occur, thus further reducing the lead wire resistance similarly.

Next described is a method for forming the ohmic electrode in the second embodiment.

First, the IVA-group metal or alloy is vapor-deposited in the thickness in the range of 3 to 200 nm, preferably in the range of 3 to 50 nm, on the p-type diamond layer 20 formed on the substrate 10 to form the contact electrode layer 30.

Next, the diffusion barrier layer 40 is formed by vapor-depositing either at least one metal selected from a metal group consisting of W, Mo, Ta, Os, Re, Rh, and Pt, or an alloy containing at least one metal selected from the metal group in the thickness in the range of 10 to 2000 nm on the contact electrode layer 30.

Next, the substance, such as Au, is vapor-deposited on the diffusion barrier layer 40 to form the lead electrode layer 50.

Here, the vapor deposition method may be selected from the various techniques as listed in the first embodiment.

Also, the contact electrode layer 30 may be formed in such a manner that the substrate is first set to a temperature of not lower than 300° C. by heating an electrode portion of the substrate 10 and then the IVA metal or alloy is vapor-deposited on the p-type diamond layer 20.

Further, the heat treatment of the contact electrode layer 30 may be an annealing treatment in an environment of vacuum or Ar gas as heated at a temperature of not lower than 300° C. after the vapor deposition of the IVA-group metal or alloy on the p-type diamond layer 20.

Also, the contact electrode layer 30 may be washed with an acid solution, such as hydrofluoric acid (HF) or hydrofluoric acid/nitric acid ($HF/HNO_3$), after the formation of the contact electrode layer 30 and before the formation of the diffusion barrier layer 40.

Further, a heat treatment may be applied in forming the diffusion barrier layer 40 and the lead electrode layer 50, similarly as in forming the contact electrode layer 30.

As for the formation of the contact electrode layer 30, a preferable arrangement is such that the carbide of the IVA-group metal or alloy is vapor-deposited on the p-type diamond layer 20.

Next described are the operational effects of the method for forming the ohmic electrode in the second embodiment.

When the IVA-group metal or alloy is vapor-deposited on the p-type diamond layer 20 and the heat treatment is carried out at a temperature of not lower than 300° C., the metal or alloy forming the contact electrode layer 30 thermally diffuses into the p-type diamond layer 20 and vice versa, reacting with diamond to form a carbide thereof. As a result, comparing with the case where the carbide of the metal or alloy forming the contact electrode layer 30 is directly formed on the p-type diamond layer 20, a superior interface with less defects is formed between the p-type diamond layer 20 and the contact electrode layer 30, thus lowering the contact resistance to the p-type diamond layer 20.

The metal or alloy forming the contact electrode layer 30 thus becomes stabilized in respect of energy by forming the carbide, so as to become unlikely to diffuse. Since the metal or alloy forming the contact electrode layer 30 is stable up to a temperature near the melting point thereof higher than that of the metal or alloy itself, it is superior in heat resistance.

Accordingly, little metal or alloy forming the contact electrode layer 30 precipitates on the surface of the lead electrode layer 50, thus lowering the lead wire resistance. Therefore, the ohmic contacts with high heat resistance and low contact resistance can be formed with excellent reproducibility on the p-type diamond layer 20.

Washing the contact electrode layer 30 with the acid solution after the formation of the contact electrode layer 30 and before the formation of the diffusion barrier layer 40, the metal or alloy not forming the carbide thereof can be removed from the contact electrode layer 30.

Further, forming the diffusion barrier layer 40 and lead electrode layer 50 by the heat treatment, similarly as in the formation of the contact electrode layer 30, adhesion can be improved between the layers of laminated contact electrode layer 30, diffusion barrier layer 40, and lead electrode layer 50.

Forming the contact electrode layer 30 by vapor-depositing the carbide of the IVA-group metal or alloy on the p-type diamond layer 20, the metal or alloy forming the contact electrode layer 30 is stabler in energy because of the reduced formation enthalpy than the metal or alloy itself, so that it is very unlikely to diffuse.

Next described are experiments as to the second embodiment.

Figure 5:
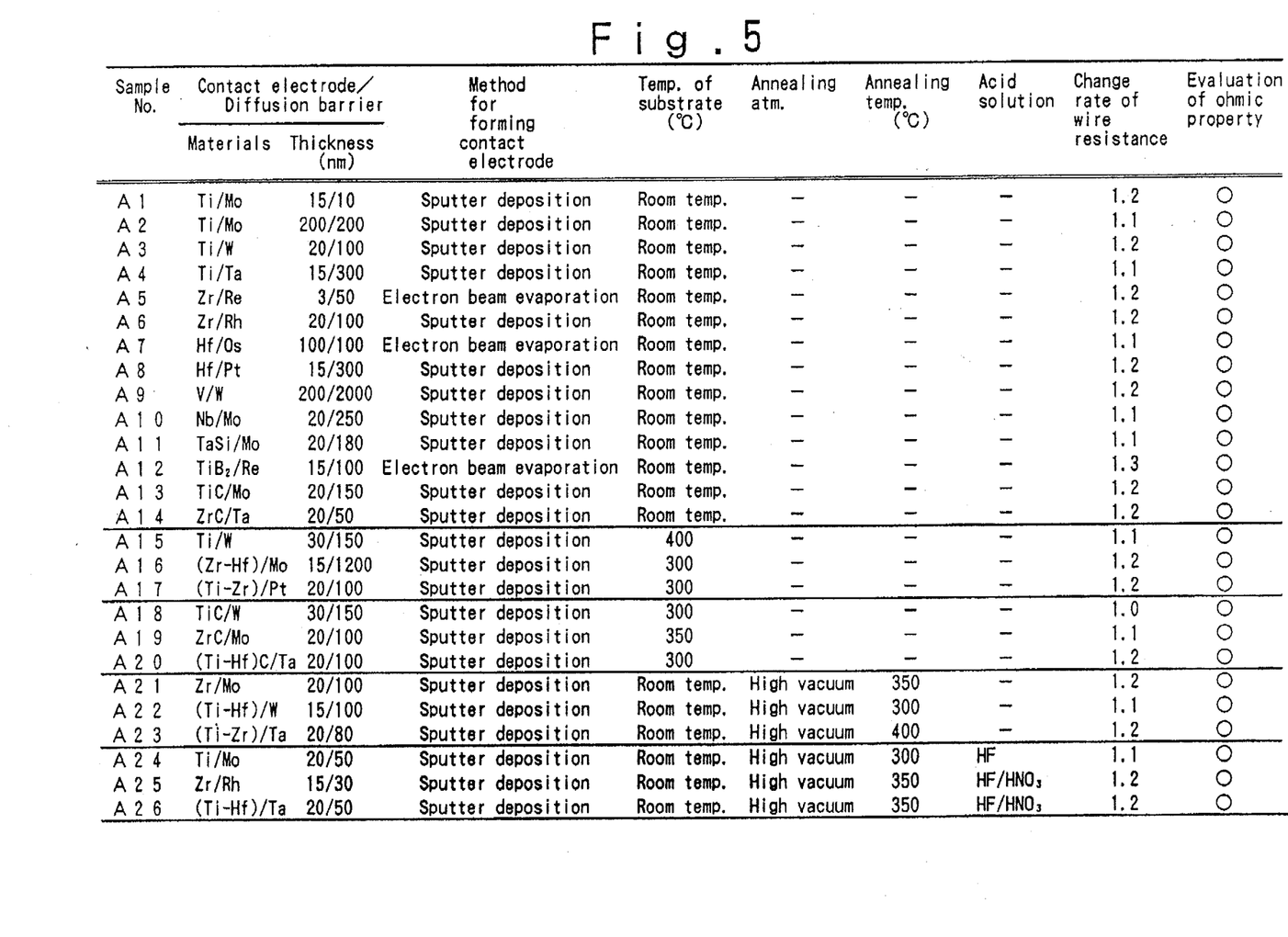
FIG. 5 is a table to show forming conditions and performance evaluation results in the second embodiment.

First, FIG. 5 shows formation conditions and performance evaluation results as to the second embodiment. Samples No. A1 through A14 were prepared as follows. While keeping the temperature of the substrate 10 and the atmosphere at the room temperature, a IVA-group metal or alloy, or a carbide thereof was vapor-deposited in the thickness of not more than 200 nm as the contact electrode layer 30. Subsequently, the diffusion barrier layer 40 and lead electrode layer 50 were successively vapor-deposited on the contact electrode layer 30. The materials for the contact electrode layer 30 were V, Nb, TaSi, and $TiB_2$ in addition to IVA-group metals and alloys. Also, the thickness of the lead electrode layer 50 was about 200 nm.

Also, samples No. A15 through A17 were prepared as follows. The substrate 10 was first heated up to a temperature of not lower than 300° C. and then a IVA-group metal or alloy was vapor-deposited as the contact electrode layer 30 in the thickness of not more than 200 nm. Next, the temperature of the substrate 10 was lowered down to the room temperature, and the diffusion barrier layer 40 and lead electrode layer 50 were successively vapor-deposited on the contact electrode layer 30. The thickness of the lead electrode layer 50 was about 200 nm.

Additionally, samples No. A18 through A20 were prepared as follows. The substrate 10 was first heated up to a temperature of not lower than 300° C. and then a carbide of a IVA-group metal or alloy was vapor-deposited as the contact electrode layer 30 in the thickness of not more than 200 nm. Next, the temperature of the substrate 10 was lowered down to the room temperature, and the diffusion barrier layer 40 and lead electrode layer 50 were successively vapor-deposited on the contact electrode layer 30. The thickness of the lead electrode layer 50 was about 200 nm.

Moreover, samples No. A21 through A23 were prepared as follows. While keeping the temperature of the substrate 10 and the atmosphere at the room temperature, a IVA metal or alloy was vapor-deposited as the contact electrode layer 30 in the thickness of not more than 200 nm. After that, the resultant was subjected to an annealing treatment to heat it at a temperature of not lower than 300° C. in vacuum of below 10 Torr for thirty minutes. Next, the temperature of the environment was reduced down to the room temperature, and then the diffusion barrier layer 40 and lead electrode layer 50 were successively vapor-deposited on the contact electrode layer 30. The thickness of the lead electrode layer 50 was about 200 nm.

Further, samples No. A24 through A26 were prepared as follows. Keeping the temperature of the substrate 10 and the environment at the room temperature, a IVA-group metal or alloy was vapor-deposited as the contact electrode layer 30 in the thickness of not more than 200 nm. After that, the resultant was subjected to an annealing treatment to heat it at a temperature of not lower than 300° C. in vacuum of below 10 Torr for thirty minutes. Next, the contact electrode layer 30 was washed with the acid solution, such as hydrofluoric acid or hydrofluoric acid/nitric acid, to remove remaining metal or alloy not forming the carbide. Then, the temperature of the environment was lowered down to the room temperature, and the diffusion barrier layer 40 and lead electrode layer 50 were successively vapor-deposited on the contact electrode layer 30. The thickness of the lead electrode layer 50 was about 200 nm.

The thus formed samples No. A1 through A26 were subjected to a heat treatment at a temperature of 500° C. in vacuum of below $10^{-5}$ Torr for thirty minutes. The resistivity of the lead wire resistance was measured by the four-probe method before and after the heat treatment to evaluate the heat resistance, based on a change in the resistivity.

The results of the measurement demonstrated that the lead wire resistance of each sample was approximately equal to the resistance value of Au normally formed in bulk before and after the heat treatment and that a change rate of the resistance of each sample was small. Also, the surface of the lead electrode layer 50 maintained its color substantially unchanged after the heat treatment. It is thus understood that high heat resistance was well achieved.

In another experiment, the samples No. A1 through A26 were subjected to a heat treatment at a temperature of 500° C. in vacuum of below $10^{-5}$ Torr for thirty minutes. The contact resistance was measured by the TLM method before and after the heat treatment to evaluate the ohmic property to the p-type diamond layer 20, based on a change of the contact resistance.

The results of the measurement showed that the contact resistance of each sample was not more than 1 $10^{-3}$ $\Omega\cdot cm^2$, substantially unchanged before and after the heat treatment. It is thus understood that satisfactory ohmic property was achieved.

Figure 6:
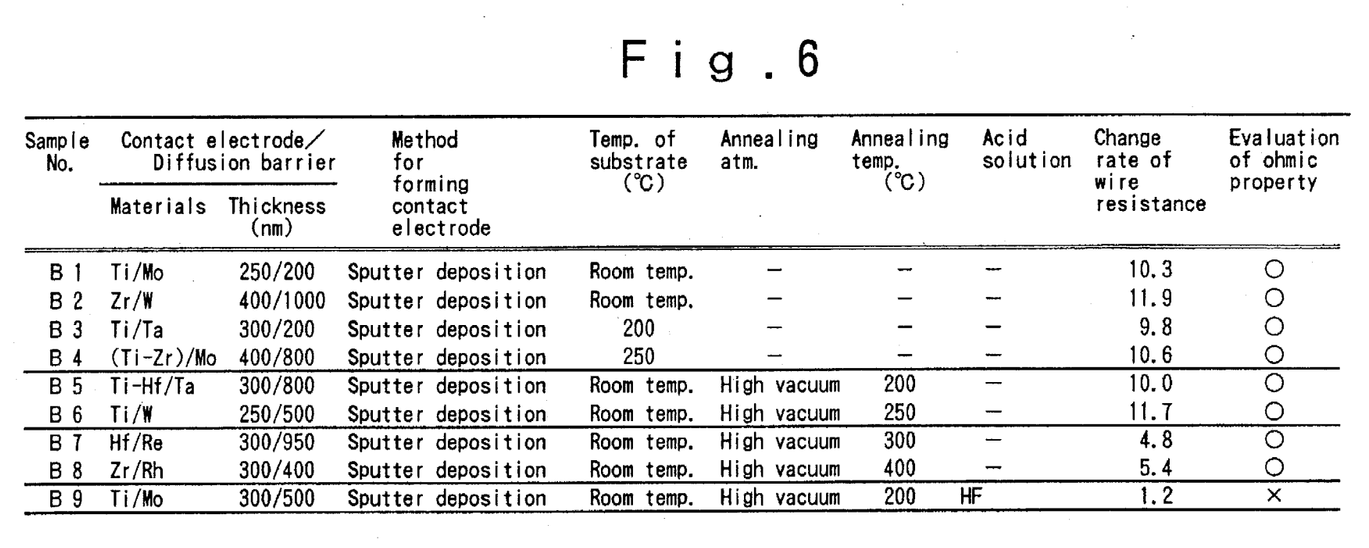
FIG. 6 is a table to show forming conditions and performance evaluation results for comparative examples to the second embodiment.

Next, FIG. 6 shows formation conditions and performance evaluation results of comparative examples to the second embodiment. Samples No. B1 through B4 were prepared as follows. Keeping the temperature of the substrate 10 and the atmosphere at the room temperature or below 300° C., a IVA-group metal or alloy was vapor-deposited as the contact electrode layer 30 in the thickness of not smaller than 200 nm. Then, while keeping the temperature of the substrate 10 and the atmosphere at the room temperature, the diffusion barrier layer 40 and lead electrode layer 50 were successively vapor-deposited on the contact electrode layer 30. The thickness of the lead electrode layer 50 was about 200 nm. (These samples correspond to the samples No. A1 through A20.)

Also, samples No. B5 and B6 were prepared as follows. Keeping the temperature of the substrate 10 and the atmosphere at the room temperature, a IVA-group metal or alloy was vapor-deposited as the contact electrode layer 30 in the thickness of not smaller than 200 nm. After that, the resultant was subjected to an annealing treatment to heat it at a temperature of lower than 300° C. in vacuum of below 10 Torr for thirty minutes. Then, the temperature of the atmosphere was reduced down to the room temperature, and the diffusion barrier layer 40 and lead electrode layer 50 were successively vapor-deposited on the contact electrode layer 30. The thickness of the lead electrode layer 50 was about 200 nm. (These samples correspond to the samples No. A21 through A23.)

Also, samples No. B7 and B8 were prepared as follows. Keeping the temperature of the substrate 10 and the atmosphere at the room temperature, a IVA-group metal was vapor-deposited as the contact electrode layer 30 in the thickness of not smaller than 200 nm. After that, the resultant was subjected to an annealing treatment to heat it at a temperature of not lower than 300° C. in vacuum of below 5 through 10 Torr for thirty minutes. Next, the temperature of the environment was reduced down to the room temperature, and the diffusion barrier layer 40 and lead electrode layer 50 were successively vapor-deposited on the contact electrode layer 30. The thickness of the lead electrode layer 50 was about 200 nm. (These samples correspond to the samples No. A21 through A23.)

Further, sample No. B9 was prepared as follows. Keeping the temperature of the substrate 10 and the atmosphere at the room temperature, a IVA-group metal was vapor-deposited as the contact electrode layer 30 in the thickness of not smaller than 200 nm. After that, the resultant was subjected to an annealing treatment to heat it at a temperature of lower than 300° C. in vacuum of below 5 through 10 Torr for thirty minutes. Next, the contact electrode layer 30 was washed with the acid solution, such as hydrofluoric acid or hydrofluoric acid/nitric acid, to remove remaining metal or alloy not forming the carbide. Subsequently, the temperature of the environment was lowered down to the room temperature, and the diffusion barrier layer 40 and lead electrode layer 50 were successively vapor-deposited on the contact electrode layer 30. The thickness of the lead electrode layer 50 was about 200 nm. (This sample corresponds to the samples No. A24 through A26.)

The thus formed samples No. B1 through B9 were subjected to a heat treatment at a temperature of 500° C. in vacuum of below $10^{-5}$ Torr for thirty minutes. The resistivity of the lead wire resistance was measured by the four-probe method before and after this heat treatment to evaluate the heat resistance, based on a change of the resistivity.

The results of the measurement demonstrated that the samples No. B1 through B8 before the heat treatment showed values of the lead wire resistance approximately equal to the resistance value of Au normally formed in bulk, but the samples after the heat treatment largely increased the lead wire resistance. Change rates of the resistance were considerably large, several to ten or more times. The surface of the lead electrode layer 50 showed completely different colors before and after the heat treatment. Analysis of composition was carried out for the surface of the lead electrode layer 50. The results of the analysis showed that the metal or alloy forming the contact electrode layer 30 precipitated and no Au remained. It is thus understood that satisfactory heat resistance was not achieved.

On the other hand, the sample No. B9 showed values of the lead wire resistance approximately equal to the resistance value of Au normally formed in bulk before and after the heat treatment, and a change rate thereof was small. Also, the surface of the lead electrode layer 30 maintained its color substantially unchanged after the heat treatment. It is thus understood that high heat resistance was well achieved.

In another example, the samples No. B1 through B9 were subjected to a heat treatment at a temperature of 500° C. in vacuum of below $10^{-5}$ Torr for thirty minutes. The contact resistance was measured by the TLM method before and after the heat treatment to evaluate the ohmic property to the p-type diamond layer 20, based on a change in the contact resistance.

The results of the measurement demonstrated that the sample No. B9 showed large values of the contact resistance before and after the heat treatment. Element analysis was conducted in the direction of the thickness for the ohmic electrode of sample No. B9. In the analysis, little element forming the contact electrode layer 30 was detected near the interface to the p-type diamond layer 20. This indicates that because the temperature of the annealing treatment after the formation of the contact electrode layer 30 was low, below 300° C., the metal or alloy forming the contact electrode layer 30 did not form the carbide thereof well near the interface to the p-type diamond layer 20 and, therefore, most metal or alloy forming the contact electrode layer 30 was removed by the washing with the acid solution. It is thus understood that satisfactory ohmic property was not achieved.

On the other hand, the samples No. B1 through B8 showed small values of the contact resistance, substantially unchanged before and after the heat treatment. It is thus understood that satisfactory ohmic property was achieved.

As detailed above, the ohmic electrode of the present invention is so arranged that the contact electrode layer is made of the carbide of at least one metal selected from the metal group consisting of Ti, Zr, and Hf, or the carbide of an alloy containing at least one metal selected from the metal group and the contact electrode layer is formed in ohmic contact with the p-type diamond semiconductor layer.

In the arrangement, the carbide of the metal or alloy forming the contact electrode layer is stabler in energy than the metal or alloy itself, so that it is very unlikely to diffuse. Then, little metal or alloy precipitates on the surface of the lead electrode layer, thus lowering the lead wire resistance.

In another ohmic electrode of the present invention, the contact electrode layer has the thickness in the range of 3 to 200 nm and is formed in ohmic contact with the p-type diamond semiconductor layer. Further formed on the contact electrode layer is the diffusion barrier layer made of either at least one metal selected from the metal group composed of W, Mo, Ta, Os, Re, Rh, and Pt, or an alloy containing at least one metal selected from the metal group.

When the ohmic contact is used under an environment at a high temperature, the metal or alloy forming the contact electrode layer starts diffusing, but it is stopped by the diffusion barrier layer formed on the contact electrode layer. As soon as the metal or alloy starts diffusing, it also starts reacting with the p-type diamond semiconductor layer. Since the contact electrode layer is thin, most metal or alloy forms the carbide thereof, thus further suppressing the diffusion. Therefore, little metal or alloy precipitates on the surface of the lead electrode layer, lowering the lead wire resistance.

In the method for forming the ohmic electrode of the present invention, the heat treatment is carried out to heat the substrate at a temperature of not lower than 300° C. in forming the contact electrode layer on the p-type diamond semiconductor layer by the vapor deposition. In another aspect, the heat treatment is carried out after the formation of the contact electrode layer to heat the contact electrode layer in an environment having a temperature of not lower than 300° C.

The heat treatment causes the mutual thermal diffusion between the metal or alloy forming the contact electrode layer and the p-type diamond semiconductor layer, so that the metal or alloy reacts with diamond to form the carbide thereof. As a result, a superior interface with less defects is formed between the p-type diamond semiconductor layer and the contact electrode layer, thus lowering the contact resistance to the p-type diamond semiconductor layer.

As described, the metal or alloy forming the contact electrode layer becomes stabilized in energy because of the formation of the carbide, so that the metal or alloy rarely diffuses so as not to precipitate on the surface of the lead electrode layer, thus lowering the lead wire resistance. Also, the metal or alloy forming the contact electrode layer is stable up to near the melting point higher than that of the metal or alloy itself and, therefore, is excellent in heat resistance.

Accordingly, the ohmic contacts with high heat resistance and low contact resistance can be formed with excellent reproducibility on the p-type diamond semiconductor layer.

Therefore, the ohmic electrodes can be applied to semiconductor devices requiring high heat resistance and high thermal conductivity. The present invention can provide the ohmic electrodes and forming methods thereof which can improve the device performance, based on the reduced lead wire resistance.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

The basic Japanese Application No. 223528/1993 filed on Sep. 8, 1993 is hereby incorporated by reference.

What is claimed is:

1. An ohmic electrode comprising:

a contact electrode layer formed on a p-type diamond semiconductor layer formed on a substrate so as to have low contact resistance and high heat resistance and to be in ohmic contact with said p-type diamond semiconductor layer; and a lead electrode layer directly formed on said contact electrode layer and made of Au so as to have low lead wire resistance and high heat resistance;

wherein said contact electrode layer is substantially made of either a carbide of at least one metal selected from a metal group consisting of Ti, Zr, and Hf, or a carbide of an alloy including at least one metal selected from said metal group, and wherein said metal or alloy remaining without forming said carbide is removed from said contact electrode layer.

2. An ohmic electrode according to claim 1, wherein said metal or alloy remaining without forming said carbide is substantially removed from said contact electrode layer by washing said contact electrode layer with an acid solution.

3. An ohmic electrode according to claim 1, wherein an interface between said p-type diamond semiconductor layer and said contact electrode layer is formed with less defects by a heat treatment to heat said p-type diamond layer and said contact electrode layer at a temperature of not lower than 300° C.

4. An ohmic electrode according to claim 1, wherein said contact electrode layer is made of a carbide of an alloy containing at least one metal selected from a metal group consisting of Ti, Zr, and Hf.

5. An ohmic electrode according to claim 4, wherein an interface between said p-type diamond semiconductor layer and said contact electrode layer is formed with less defects by a heat treatment to heat said p-type diamond layer and said contact electrode layer at a temperature of not lower than 300° C.

6. An ohmic electrode comprising:

a contact electrode layer formed on a p-type diamond semiconductor layer formed on a substrate so as to be in ohmic contact with said p-type diamond semiconductor layer and to have low contact resistance and high heat resistance;

a diffusion barrier layer directly formed on said contact electrode layer; and a lead electrode layer formed on said diffusion barrier layer and made of Au so as to have low lead wire resistance and high heat resistance;

wherein said contact electrode layer is substantially made of a carbide of a metal or alloy, and said diffusion barrier layer is made of either at least one metal selected from a metal group consisting of W, Mo, Ta, Os, Re, Rh, and Pt, or an alloy including at least one metal selected from said metal group, and wherein said metal or alloy remaining without forming said carbide is removed from said contact electrode layer.

7. An ohmic electrode according to claim 6, wherein said metal or alloy remaining without forming said carbide is substantially removed from said contact electrode layer by washing said contact electrode layer with an acid solution.

8. An ohmic electrode according to claim 6, wherein said contact electrode layer is made of either a carbide of at least one metal selected from a metal group consisting of Ti, Zr, and Hf, or a carbide of an alloy containing at least one metal selected from said metal group.

9. An ohmic electrode according to claim 6, wherein said contact electrode layer is formed to have a thickness in the range of 3 to 200 nm.

10. An ohmic electrode according to claim 6, wherein said contact electrode layer is formed to have a thickness in the range of 3 to 50 nm.

11. An ohmic electrode according to claim 6, wherein said diffusion barrier layer is formed to have a thickness in the range of 10 to 2000 nm.

12. An ohmic electrode according to claim 6, wherein an interface between said p-type diamond semiconductor layer and said contact electrode layer is formed with less defects by a heat treatment to heat said p-type diamond layer and said contact electrode layer at a temperature of not lower than 300° C.

13. An ohmic electrode according to claim 6, wherein said diffusion barrier layer is made of an alloy containing at least one metal selected from a metal group consisting of W, Mo, Ta, Os, Re, Rh, and Pt.

14. An ohmic electrode according to claim 13, wherein said contact electrode layer is made of either a carbide of at least one metal selected from a metal group comprising Ti, Zr, and Hf, or a carbide of an alloy containing at least one metal selected from said metal group.

15. An ohmic electrode according to claim 13, wherein said contact electrode layer is formed to have a thickness in the range of 3 to 200 nm.

16. An ohmic electrode according to claim 13, wherein said contact electrode layer is formed to have a thickness in the range of 3 to 50 nm.

17. An ohmic electrode according to claim 13, wherein said diffusion barrier layer is formed to have a thickness in the range of 10 to 2000 nm.

18. An ohmic electrode according to claim 13, wherein an interface between said p-type diamond semiconductor layer and said contact electrode layer is formed with less defects by a heat treatment to heat said p-type diamond layer and said contact electrode layer at a temperature of not lower than 300° C.

* * * * *